United States Patent [19]

Murasawa et al.

[11] Patent Number: 5,309,020

[45] Date of Patent: * May 3, 1994

[54] PACKAGED SEMICONDUCTOR DEVICE ASSEMBLY INCLUDING TWO INTERCONNECTED PACKAGED SEMICONDUCTOR DEVICES MOUNTED ON A COMMON SUBSTRATE

[75] Inventors: Yasuhiro Murasawa; Syuniti Uemura; Hajime Maeda, all of Itami, Japan

[73] Assignee: Mitsubishi Denki Kabushiki Kaisha, Tokyo, Japan

[*] Notice: The portion of the term of this patent subsequent to Feb. 19, 2008 has been disclaimed.

[21] Appl. No.: 783,878

[22] Filed: Oct. 29, 1991

[30] Foreign Application Priority Data

Oct. 30, 1990 [JP] Japan .................................. 2-296638

[51] Int. Cl.⁵ ..................... H01L 23/16; H01L 23/02; H01L 23/12
[52] U.S. Cl. ................................... 257/685; 257/723; 257/724
[58] Field of Search ............................. 357/75, 80, 74; 257/685, 686, 723, 724, 777, 778

[56] References Cited

U.S. PATENT DOCUMENTS 4,994,896 2/1991 Uemura et al. ................ 357/75

FOREIGN PATENT DOCUMENTS 60-200559 10/1985 Japan .
61-244504 10/1986 Japan .
63-296292 12/1988 Japan .
2145561 3/1985 United Kingdom .

Primary Examiner—William Mintel
Assistant Examiner—S. V. Clark
Attorney, Agent, or Firm—Leydig, Voit & Mayer

[57] ABSTRACT

A semiconductor device includes a package substrate, a first IC package having external lead terminals which are downwardly bent with respect to a plane surface of the package and a second IC package having external lead terminals which are upwardly bent with respect to a plane surface of the package. These packages are disposed on one surface of the package substrate parallel to each other. One or more pairs of the external lead terminals of the first and second IC packages, which face each other and are electrically connected with to each other, are disposed on the same mount pads provided on the package substrate. Therefore, wires for connecting those lead terminals can be dispensed with and the other external lead terminals can be connected by simply drawing around wires without providing through holes. In addition, no positional deviation between the two packages, occurs and no solder bridges are created during soldering.

2 Claims, 5 Drawing Sheets

FIG. 6 (a)
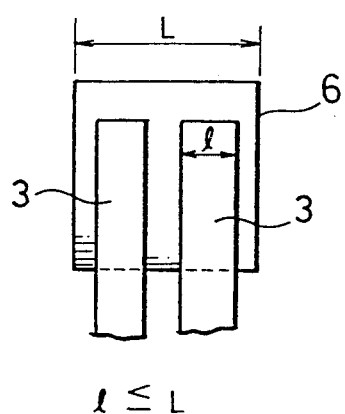
$\ell \leqq L$
FIG. 6 (b)
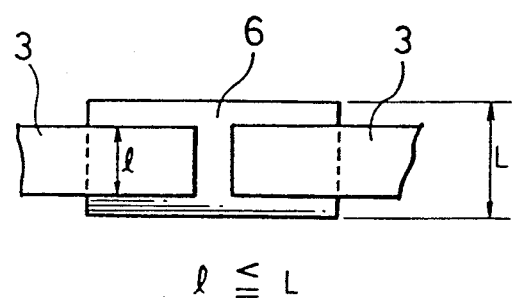
$\ell \leqq L$
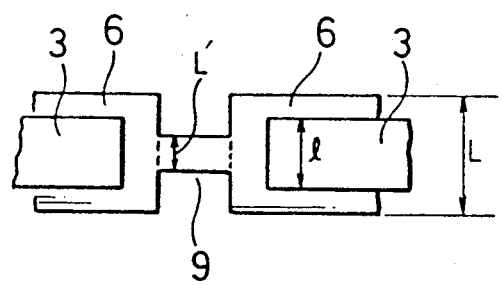
FIG. 6 (c)

PACKAGED SEMICONDUCTOR DEVICE ASSEMBLY INCLUDING TWO INTERCONNECTED PACKAGED SEMICONDUCTOR DEVICES MOUNTED ON A COMMON SUBSTRATE

FIELD OF THE INVENTION

The present invention relates to a semiconductor device which is formed by mounting semiconductor packages having integrated circuits on a package substrate.

BACKGROUND OF THE INVENTION

FIG. 4(a) is a plan view showing an IC package having external lead terminals which are bent toward one of the plane surfaces of the package (hereinafter referred to as an A-type IC package). FIGS. 4(b) to 4(d) are a side elevational view, a front elevational view, and a sectional view, respectively, of the A-type IC package. Here, a small outline package (SOP) is employed. As shown in FIG. 4(d), an IC chip 7 disposed on a die pad 10 is electrically connected with external lead terminals 2 by bonding wires 11. The die pad 10, the IC chip 7, parts of the external lead terminals 2 and the bonding wires 11 are encapsulated in a molded plastic to produce the A-type IC package 1a.

FIG. 2 is a plan view showing a prior part semiconductor device in which a pair of A-type IC packages are mounted on one side of a package substrate. In FIG. 2, the A-type packages 1a are mounted on the package substrate 5. Soldering portions 3 of the external lead terminals 2 are connected to the package substrate 5 by solder, and thus the A-type packages 1a are fixed onto the package substrate 5. The A-type packages 1a are connected with each other by wires 9 and through holes 8. The external lead terminals 2 have pin numbers crc ~crc, respectively.

Description is given of a method for mounting the A-type IC package Ia on the package substrate 5. FIG. 3 is an enlarged sectional view of a lead connection of the A-type IC package. First, solder 4 is previously applied to a mount pad 6 of each electrode portion on the surface of the package substrate 5. Then the package 1a is mounted on the package substrate 5 by soldering the portion 3 of the external lead terminal 2 to the mount pad 6 with the solder 4 and electrically and mechanically connected to the pad 6.

In order to obtain a construction in which two A-type packages 1a are mounted on the substrate 5 and the external lead terminals 2 of the packages having the same numbers of pins are mutually connected with each other as shown in FIG. 2, it is necessary to provide wires 9 in complicated arrangements and also to provide through holes 8 penetrating the package substrate 5.

As described above, in this prior art semiconductor device, a pair of A-type packages are mounted on one surface of the package substrate and the external lead terminals of the packages having the same numbers of pins are connected with each other as shown in FIG. 2. Then, wires 9 inevitably intersect each other and wiring arrangements are provided. Further through holes must be provided penetrating through the package substrate 5.

SUMMARY OF THE INVENTION

It is an object of the present invention to provide a semiconductor device in which external lead terminals of two packages, which are to be electrically connected with each other and which have the same numbers of pins arranged symmetrically with each other, are connected on the same mount pads with no intersection of wires and no necessity of providing through holes, in a single-surface mounting of IC packages.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with an aspect of the present invention, a first IC package having external lead terminals which are downwardly bent with respect to a plane surface of the package and a second IC package having external lead terminals which are upwardly bent with respect to a plane surface of the package are mounted on one surface of a package substrate such that the external lead terminals of the two packages, face each other, are electrically connected with each and are arranged on the same mount pads. Therefore, wires with complicated arrangements and through holes are dispensed with. In addition, in a construction where the external lead terminals of the two packages are arranged such that the external lead terminals of either package are arranged between those of the other package, high density mounting can be achieved.

BRIEF DESCRIPTION OF THE DRAWINGS

FIGS. 6(a) to 6(c) are diagrams showing a distinction between a mount pad and a wire.

DETAILED DESCRIPTION OF THE PREFERRED EMBODIMENTS

An embodiment of the present invention will be described in detail with reference to the drawings.

Figure 5A:
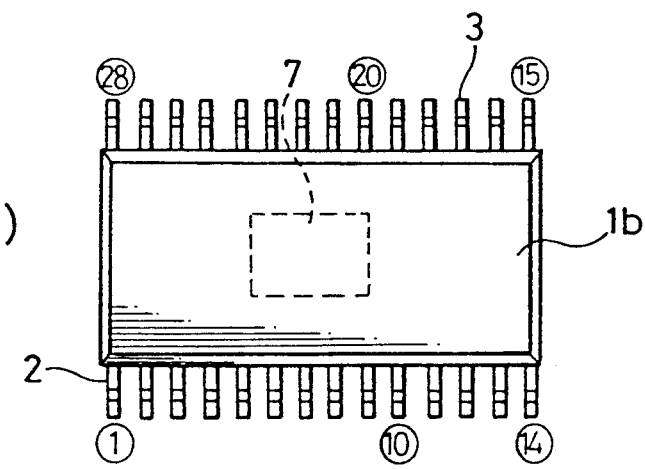
FIGS. 5(a) to 5(d) are a plan view, a side elevational view, a front elevational view, and a sectional view, respectively, of a B-type IC package.
Figure 5B:
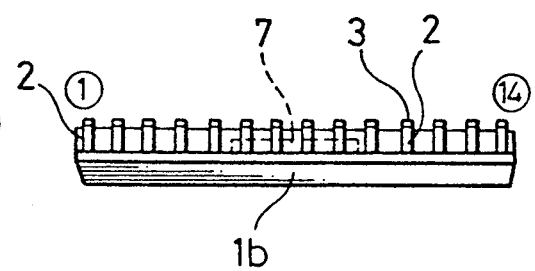
Figure 5C:
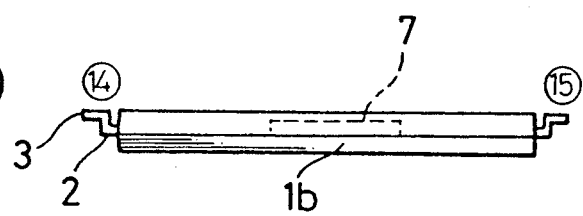
Figure 5D:
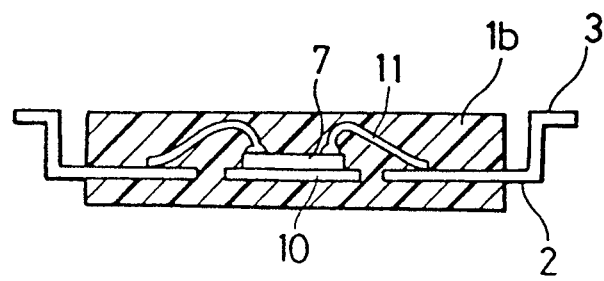

FIG. 5(a) is a plan view showing an IC package having external lead terminals 2 which are upwardly bent toward one of the plane surface of the package (hereinafter referred to as a B-type package). FIGS. 5(b) to 5(d) are a side elevational view, a front elevational view, and a sectional view, respectively, of the B-type package. This B-type package is different from the aforementioned A-type package in that the external lead terminals are bent toward a plane surface of the package opposite the plane surface of the package toward which the terminals of the A-type package are bent. In other words, the A-type and B-type packages are identical except for the opposite directions, relative to the corresponding plane surfaces of the A-type and B-type packages, in which the external lead terminals are bent.

Figure 1:
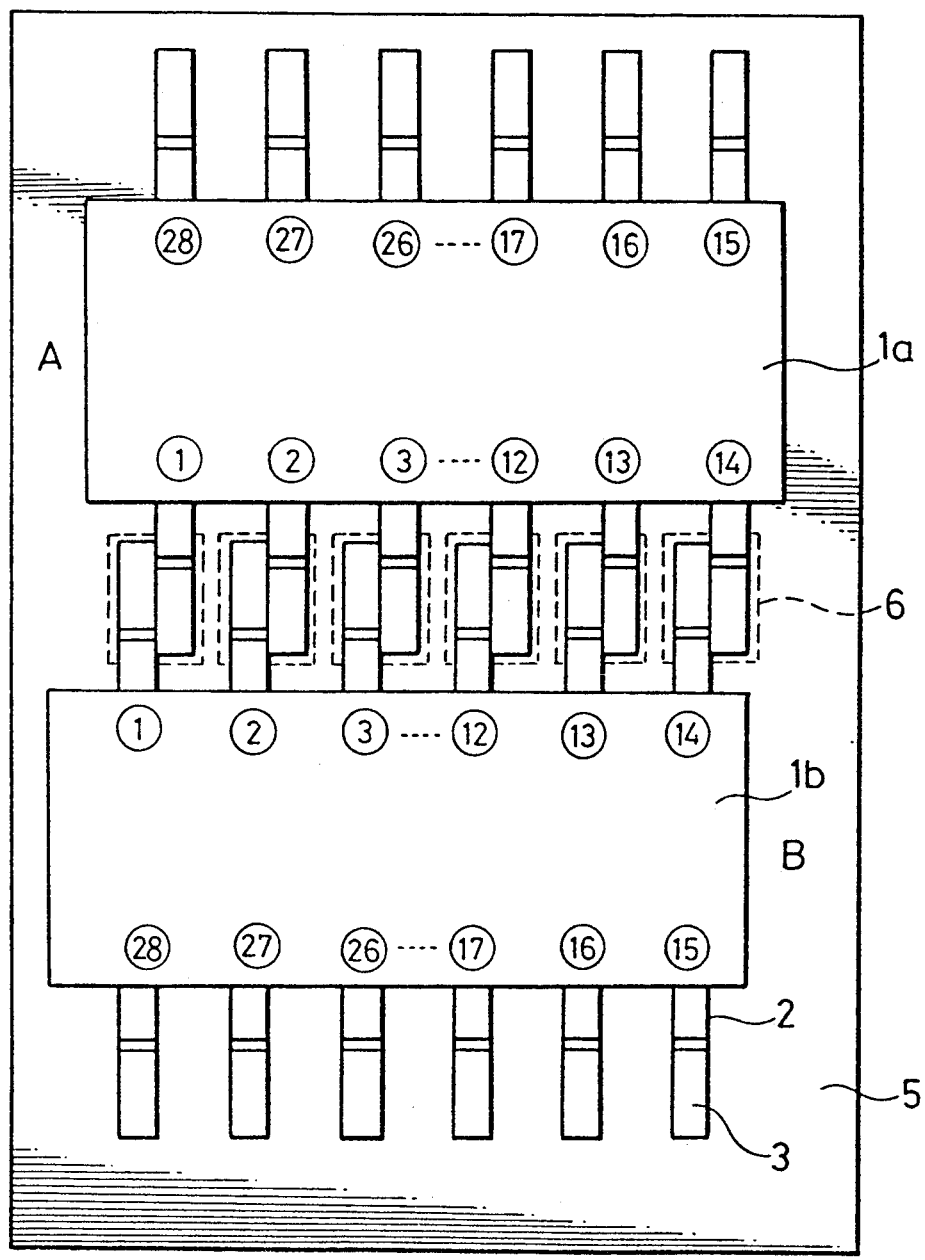
FIG. 1 is a plan view showing a semiconductor device on which IC packages are mounted in accordance with an embodiment of the present invention.
Figure 2:
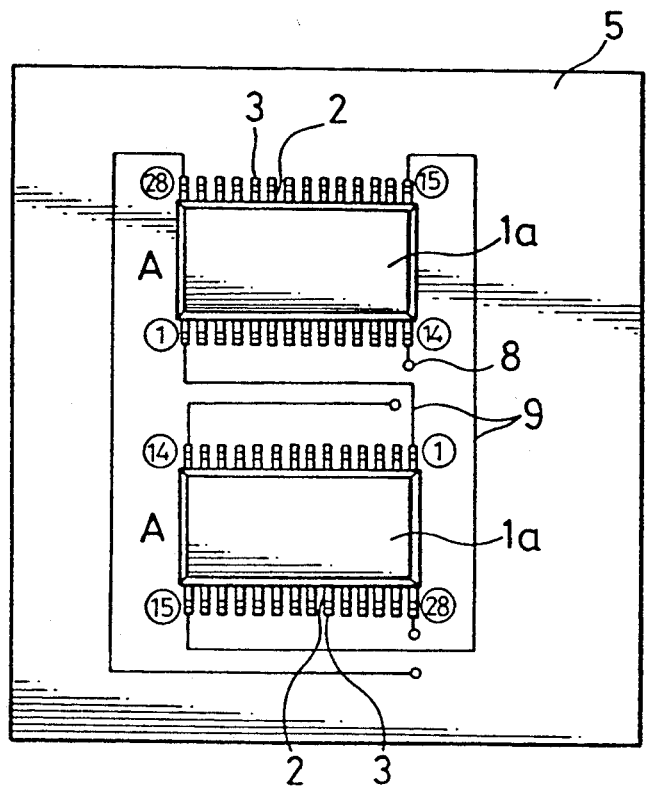
FIG. 2 is a plan view showing a semiconductor device on which IC packages are mounted in accordance with the prior art.
Figure 3:
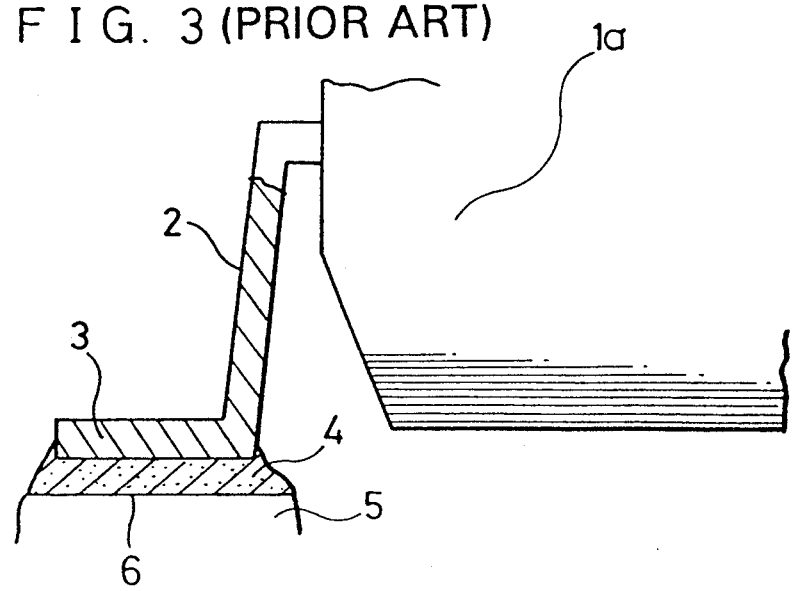
FIG. 3 is an enlarged sectional view of a lead connection part of the IC package shown in FIG. 2.
Figure 4:
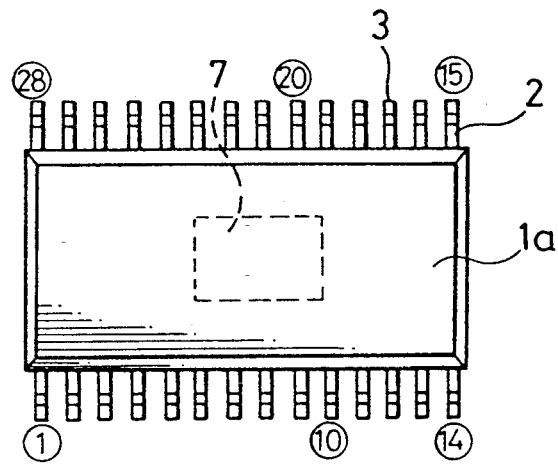
FIGS. 4(a) to 4(d) are a plan view, a side elevational view, a front elevational view, and a sectional view, respectively, of an A-type IC package.
Figure 4:
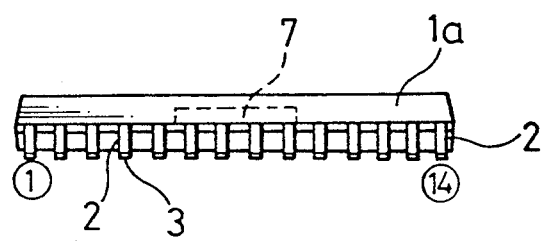
Figure 4:
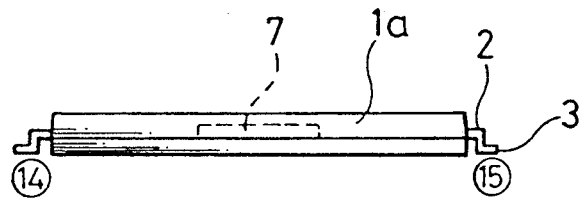
Figure 4:
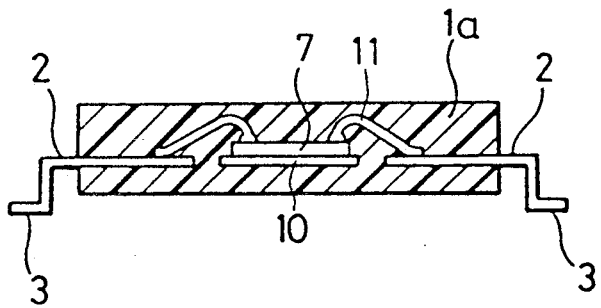

FIG. 1 is a plan view showing a semiconductor device in accordance with an embodiment of the present invention. In FIG. 1, the A-type IC package 1a and the B-type IC package 1b are mounted on the package substrate 5. External lead terminals 2 of the respective packages 1a and 1b are designated by pin numbers crc to crc.

As described above, the A-type package 1a and the B-type package 1b are different from each other only in the direction of bending of the external lead terminals. Therefore, when the A-type package 1a and the B-type package 1b are arranged in approximately parallel with each other on the substrate 5 as shown in FIG. 1, the lead terminals 2 of the A-type package 1a having pin numbers of crc to crc are arranged in positions in a mirror image symmetry with the with positions of the external lead terminals 2 of the B-type package 1b having the same pin numbers. That symmetry, as shown in FIG. 1, is a mirror image symmetry.

Description is given of the function and effect hereinafter.

In this embodiment, two kinds of packages, i.e., the A-type package 1a and the B-type package 1b, are mounted on the package substrate 5 unlike the conventional mounting.

In a case of single-surface mounting, the A-type and B-type packages 1a and 1b are mounted on the same surface of the package substrate 5 as shown in FIG. 1. In this case, external lead terminals 2 of the package 1a are arranged in positions in a mirror image symmetry with positions of the external lead terminals 2 of the package 1b having the same pin numbers. Therefore, the, external lead terminals facing each other, i.e., pairs of leads 2 with pin numbers crc 1 to crc 14 of packages 1a and 1b, are arranged on the same mount pads 6, so that wires can be dispensed with. In addition, other external lead terminals, i.e., external lead terminals of with pin numbers crc 15 to crc 28 of packages 1a and 1b, are electrically connected the corresponding pin number leads of the other package with wires without the necessity of providing through holes in the package substrate 5.

In the above embodiment of FIG. 1, since the external lead terminals 2 with pin numbers 1 to 14 of the B-type package 1b are arranged between the lead terminals 2 with pin numbers 1 to 14 of the A-type package 1a, the soldering portions 3 of the external lead terminals 2 respective of respective packages 1a and 1b are with pin number 1 to 14 arranged on corresponding mount pads without external wires. In addition to the above-described effects, the area of the substrate on which these packages are mounted can be reduced, resulting in high-density mounting.

Methods for mounting the soldering portions 3 of the external lead terminals 2 (hereinafter referred to simply as leads 3) on the common mount pads 6 are illustrated in FIGS. 6(a) to 6(c).

Each mount pad 6 is fundamentally, a conductor used for connection or installation of elements. Now suppose that the width of a lead is l and the width of the member connecting two leads (i.e., the mount pad or wire) is L. In case of FIG. 6(a), if $2l \leq L$, it can be said that the two leads 3 are mounted on the same mount pad 6. In case of FIG. 6(b), if $l \leq L$, it can be said that the two leads 3 are mounted on the same mount pad 6. However, in case of FIG. 6(c), a portion 9 having a width of L' which is narrower than the width of the lead 3, that is L'<l, is provided and this portion 9 is recognized as a wire. However, wires are covered with insulating solder resist in many cases. Therefore, such a case where two or more leads are mounted on an area on which mounting of elements is possible is construed in the present invention as connection of leads on the same mount pad.

As described above, in the above-described embodiment, the A-type package having external lead terminals bent in one direction and the B-type package having, external lead terminals bent in an opposite direction are mounted on the package substrate and the external lead terminals of both packages are located symmetrically with each other, so that the external lead terminals corresponding to the two packages facing each other can be electrically connected to the same mount pads. Therefore, there is no necessity of providing wires for connecting those lead terminals and the other external lead terminals can also be connected by simply drawing around wires without providing through holes. In addition, no positional deviation between the two packages occurs and no solder bridges owing to a complicated soldering occurs.

While in the above embodiment small outline packages are described, the present invention can also be applied to a plastic leaded chip carrier (PLCC) having external lead terminals formed into J-shape or a J lead type small outline package having J-shaped leads. Thus, the present invention is applicable to all surface-mounting type packages.

While in the above embodiment pin numbers are allotted to the external lead terminals and lead terminals having the same pin numbers are connected with each other, the pin numbers need not always be allotted if two lead terminals to be electrically connected are certainly connected with each other. In, addition, all of the lead . terminals are not necessarily connected. However, at least a pair of lead terminals are connected.

While in the above embodiment the external lead terminals are connected between two IC packages, one or more pairs of external lead terminals of the same IC package, which are adjacent to each other, can be connected to the same mount pads 6 as shown in FIG. 6(a).

What is claimed is:

1. A semiconductor device assembly comprising:
    a first packaged semiconductor device having a package with first and second opposed package surfaces and a plurality of external lead terminals extending from the package and arranged in a predetermined configuration, said external lead terminals being bent toward the first package surface;
    a second packaged semiconductor device identical to the first packaged semiconductor device so that each external lead terminal of said first packaged semiconductor device has a corresponding external lead terminal in said second packaged semiconductor device except that the external lead terminals of said second packaged semiconductor device are bent toward the second package surface;
    a substrate having a first surface including a plurality of spaced apart, electrically conducting mount pads disposed on the first surface of said substrate wherein said first packaged semiconductor device is mounted on the first surface of said substrate with the second package surface of said first packaged semiconductor device facing the first surface of said substrate and with respective external lead terminals of said first packaged semiconductor device mounted on corresponding mount pads and said second packaged semiconductor device is mounted on the first surface of said substrate with the first package surface of said second packaged semiconductor device facing the first surface of said substrate and with respective external lead terminals of said second packaged semiconductor device mounted on corresponding mount pads, corresponding external lead terminals of said first and second packaged semiconductor devices being respectively mounted on the same mount pads, thereby interconnecting corresponding external lead terminals of said first and second packaged semiconductor devices.

2. The semiconductor device assembly of claim 1 wherein at least some of the corresponding external lead terminals of said first and second packaged semiconductor devices are not commonly connected to the same mount pads on the first surface of said package substrate.

* * * * *